INVENTOR
JAY C. KARP

BY Alexander & Dowell
ATTORNEYS

INTEGRATED CIRCUIT SEALING METHOD AND STRUCTURE

Filed Dec. 29, 1964

3 Sheets-Sheet 2

INVENTOR
JAY C. KARP

BY Alexander & Dowell
ATTORNEYS

Oct. 31, 1967 J. C. KARP 3,349,481

INTEGRATED CIRCUIT SEALING METHOD AND STRUCTURE

Filed Dec. 29, 1964 3 Sheets-Sheet 3

INVENTOR
JAY C. KARP

BY Alexander & Dowell
ATTORNEYS

United States Patent Office 3,349,481

Patented Oct. 31, 1967

3,349,481

INTEGRATED CIRCUIT SEALING METHOD AND STRUCTURE

Jay C. Karp, Wheaton, Md., assignor to Alpha Microelectronics Company, Inc., a corporation of Maryland Filed Dec. 29, 1964, Ser. No. 421,769
6 Claims. (Cl. 29—627)

This invention relates to the making and hermetic sealing of integrated microelectronic circuitry of the type deposited on a substrate and particularly relates to improve structures and production processes providing fully sealed circuitry with a minimum number of steps.

There are a number of different approaches used to seal modular electronic circuitry, generally involving the fabrication or assembly of manufactured components upon a circuit board to which conductors have been applied, and then sealing the board and components by bonding a cover or container over the board, examples of such techniques appearing in U.S. Patents 2,995,686, 3,065,291, 2,989,669, and 2,898,522. These techniques generally include some way of bringing leads from the interior circuitry outside the sealed module, for example as shown in Patent 3,105,868, but these teachings do not provide optimum techniques when applied to integrated circuitry of the deposited type.

The word "integrated" as used in this specification refers to circuitry in which the circuit components are created on the substrate itself by deposition techniques, somewhat in the way that an oil painting is built up on a canvas by applying layers of bulk materials, and thus the term "integrated" distinguishes these circuits from those made by assembling prefabricated circuit components in the usual way.

Integrated circuitry can be made using various deposition techniques, for example including vacuum deposition, sputtering, silk screen deposition, or pyrolytic decomposition in which a film is deposited on the substrate and then changed to another desired state by the application of heat thereto.

The making of integrated circuitry by deposition employs very advanced techniques, usually involving vacuum chamber techniques and often involving the application of considerable heat. Unfortunately the presence of semiconductor materials, which are quite heat sensitive, will limit the amount of heat which can be safely employed and therefore may rule out certain convenient heat sealing methods, although the use of metal-film field-effect amplifiers can eliminate semiconductors from the deposited circuits and thereby permit more heat to be used during their manufacture.

The techniques involved in making integrated circuitry require a great deal of set-up preparation time since most of the deposition is done in a vacuum. Therefore, every time a different type of manufacturing step has to be performed, the vacuum must be broken to gain access to the circuitry, and then a new vacuum must be drawn on the circuitry before the next step can be performed. On a production basis, the saving of even one step involving the breaking of the vacuum can be a very substantial saving, and the present invention has for its principal purpose the elimination of unnecessary production steps.

It is a principal object of this invention to provide a process for sealing integrated circuitry into a package, preferably in which the substrate itself forms a part of the package. It is an important feature of the present invention to provide a method and means for extending certain conductors within the package to be sealed to positions outside of the package so that external connections can be made to the circuitry therewithin. The substrate itself may comprise one of a number of different materials commonly used for this purpose. One principal material is glass; another is ceramic material; and a third and rather new substrate material is known as H-film which is a name given to a new generation of Mylar materials which can stand temperatures up to about 800° C., and which also accept metallization in a superior manner. There are, of course, many other possible substrates including a large number of different plastics.

In the above-mentioned group of prior-art patents, for the most part the prefabricated circuit components have been assembled on a circuit board and the various enclosing parts have been shaped so as to seal the circuit boards to form a package, these parts having been especially provided with channels through which internal conductors can be brought outside. Since the present invention is useful primarily in the microcircuitry art it is not practical to try to bring conductors having substantial thicknesses to the outside of the package, but instead, the present invention seeks to use a technique of the general type described in Patent 2,141,677 in which certain parts of the package which are insulators are metalized in order to provide leads coming out of the package for external connections.

In brief, the present invention involves using a suitable insulating substrate which is provided with a peripheral lip or ridge around its outer boundaries which lip stands up from the surface of the substrate to a height sufficient to provide clearance for the circuitry which will be deposited within the recessed central portion. This structure can also be thought of as being a relatively thick wafer provided with a recessed cavity in its central portion to receive its modular circuitry. Prior to deposition of the circuit elements themselves within the recessed cavity, the wafer is first provided with metalized connectors, each having a portion of its length located on what will be an outside surface of the finished package, and these metalized connectors are then extended across the seal and into the recessed cavity a short distance, for instance by firing them into a glass wafer, but before the circuitry is deposited thereon. The micro-circuitry itself is then deposited in the recessed cavity with the deposited elements overlapping or otherwise contacting portions of the metalized connectors which lie within the cavity. When deposition of the circuitry has been completed, the only remaining step is to place a closure over the peripheral ridge portion of the substrate and bond this closure thereto. The closure means itself may comprise the outside surface of another similarly shaped wafer, or it may be a flat plate, or even a cupped plate with a peripheral lip.

The closure means itself may be either a conductor, or a non-conductor, or it may be a substrate material having additional circuitry applied to it. For example, in a deposited circuit whenever one conductor must cross another, an insulator must first be deposited on the conductor at the crossing point. The necessity of depositing such an insulator can be avoided by applying the upper conductor to the inside of the closure means and connecting the ends of this conductor to metalized contacts provided for this purpose on the upper surfaces of the peripheral ridge or lip of the main substrate wafer.

In the event that a metal closure plate is used, the metalized connectors obviously cannot extend across the upper surface of the peripheral lip because they would be short-circuited together by the cover plate. A very satisfactory way of avoiding this difficulty includes the providing of a main recessed wafer composed of two parts, respectively including a flat plate of substrate material, and an open frame of insulating material which, when placed around the boundary of the plate, will form the said peripheral ridge. Before these two parts are bonded together, connector strips are applied in the vicinity of the periphery of the substrate plate by metallization, and likewise portions of the bottom surface of the open frame as well as outside faces thereof are metalized in locations where the metalizations on the two parts will mutually register. Thus, when the open frame is layed against the plate and bonded thereto, the metalized connectors will extend from inside of the frame on the surface of the plate, through the interface between the plate and the frame, and to the outside surface of the frame, while at the same time leaving the upper surfaces of the frame free of any connecting conductors. If desired, a strip can be metalized around the upper surface of the frame in order to provide a surface to which a metal closure plate can be soldered, if such technique is to be used in finally sealing the modular wafer.

On the other hand, in the event that the closure plate is to be of a non-conductive material, the metalized connectors can extend from the bottom surface of the circuit-receiving cavity, up the inner surface of the lip, across its top surface, and down its outside surface in order to provide external connecting metal zones, and all this prior to the deposition of the sensitive part of the circuitry itself.

Another possibility for sealing the recessed wafer after the circuitry has been deposited therein and connected to the external connectors, is to pour the recessed portion containing the circuitry full of sealing material according to a technique generally referred to in the art as passivation.

It is contemplated that one of several different techniques can be used in applying the external connectors to the substrate materials. For example, one of the most satisfactory ways is to apply a glass frit containing metal particles to the surface of a glass wafer by any suitable method including spraying, brushing, etc., and then heating the wafer to a high enough temperature to fire the metallic frit into the glass surface. A technique of this same general type can be used in connection with plastics and also ceramics, although in the latter cases the mechanism does not lead to a substantially homogeneous dissolving of the applied metallic particles into the surface. An important advance of the present invention is that all of the high temperature firing of the external-connection conductors into the substrate materials is completed prior to the deposition of any of the heat-sensitive circuit elements onto the substrate.

Although the present disclosure has been illustrated in terms of a wafer having a cavity in its surface so as to recess the electronic circuitry beneath the lip portion of the wafer, it is to be understood that a cavity need not be provided in cases where the deposited circuitry has virtually no height above the surface upon which it is deposited.

So far, this novel technique has been described in connection with the forming of a single micro-circuit, and joining the deposited circuitry to metalized external connectors by overlapping or otherwise contacting them at metal interfaces. However, one of the greatest advantages of the present invention is realized by using this technique to simultaneously accomplish the manufacture of a large number of similar wafers, by performing each step upon all of the wafers simultaneously. For example, the present invention contemplates the use of a large sheet of substrate material, perhaps resembling the surface of a waffle in which depressions are provided to form the cavities, and in which the ridges between the depressions form the lips around the individual packages when, after completion of the circuit deposition steps, the large substrate waffle plate is diced into individual wafers by scoring and breaking the larger substrate or by diamond sawing the sheet along the centers of the raised ridges. In this event, it will be apparent that the metalized connectors cannot extend down the outer surfaces of the lips on the individual wafers because these surfaces are sawed apart in order to separate the larger waffle plate into individual wafers. However, this difficulty can be avoided by making the upper surfaces of the waffle-plate ridges wide enough that the metalized connectors can extend out beyond the edges of a cover plate applied over the cavity, where the cover plate does not extend fully out to the outer periphery of the diced wafer.

The present invention has particular applicability to micro-circuitry in which one object is to place more and more circuitry in less and less space using as much of the package to support the circuitry as possible. It is therefore more economical to make both halves of the package support circuit elements which, advantageously, may be mutually connected together at the areas where the two halves of the package are later bonded so that at least some of the metalized surfaces on one half of the package are joined to registering conductive surfaces on the other half of the package.

This technique provides the further advantage of permitting certain circuit components which are not heat sensitive to be separated from heat-sensitive units and place in one half of the package, and by placing all of the heat sensitive components in the other half of the package. In this way, the non-sensitive components in the first half of the package can enjoy the benefit of a larger range of manufacturing techniques performed at higher temperatures. Likewise, a further economy can be realized by placing in one half of the package those components having a low production yield, and in the other half of the package those components having a high production yield with regard to the number of rejects. In this way, the amount of waste due to necessary discarding of out-of-tolerance production can be minimized. The above economies operate to make mass production of this type of micro-circuitry more attractive than it has been to the present time.

This novel and improved technique is not strictly limited to the circuitry which is 100% integrated, but is also applicable to semi-integrated circuitry in which certain prefabricated parts may be incorporated with the circuit conductors and elements which are applied to the substrate by deposition techniques. Other objects and advantages of the present invention will become apparent during the following discussion of the drawing, wherein.

Figures 8, 9, 10, 11, 12, 13, 14, 15:
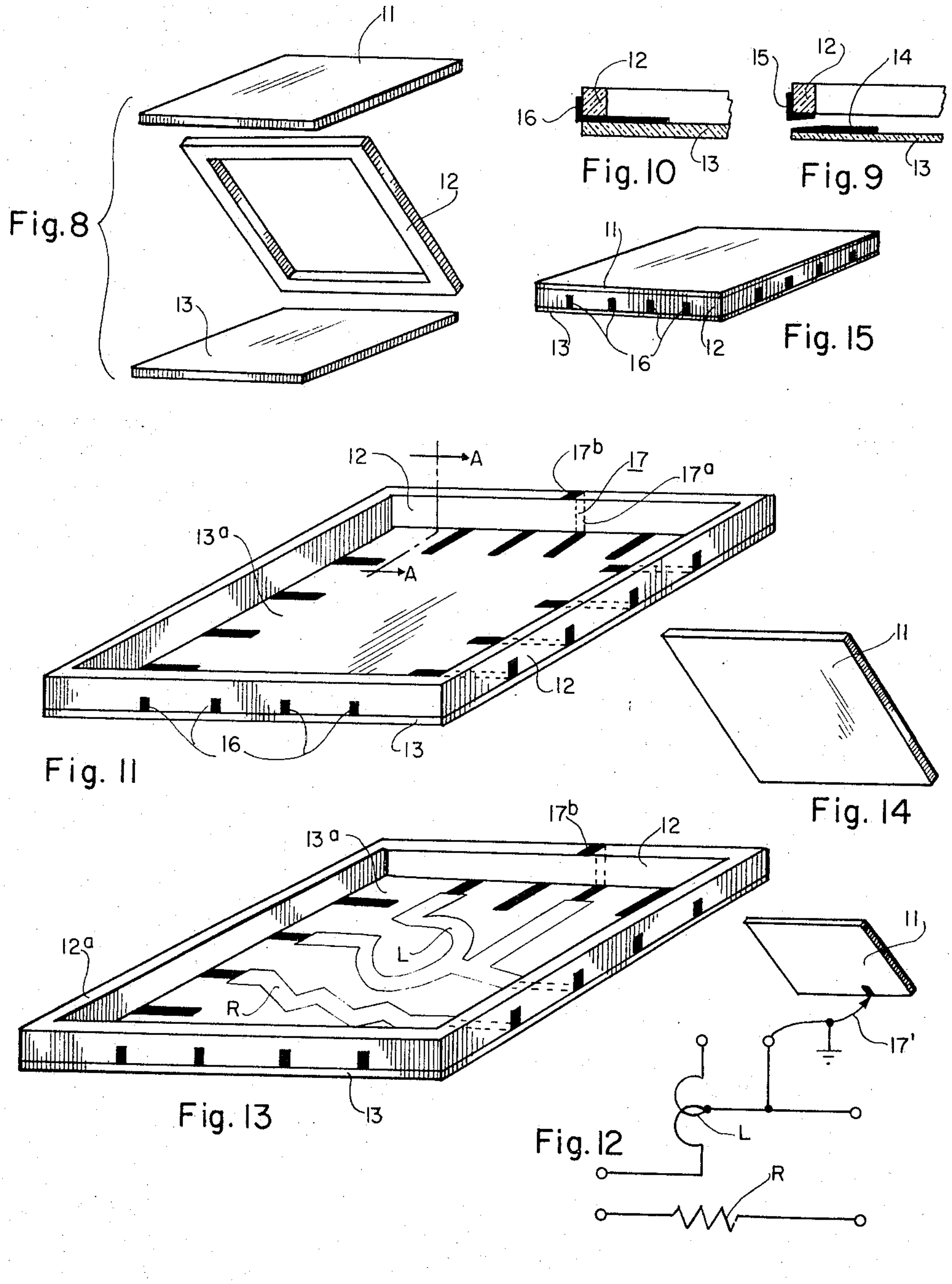
FIG. 8 shows a three-element modular package in an exploded perspective view comprising a first modified form of the invention.
FIGS. 9 and 10 are partial sectional views taken along line A—A in FIG. 11 and showing steps in the applying and joining of metal connector strips.
FIG. 11 is a perspective view showing two of the three modular elements joined together and provided with metalized connector strips.
FIG. 12 shows a schematic diagram of a circuit to be deposited in the partial assembly shown in FIG. 11.
Figure 18:
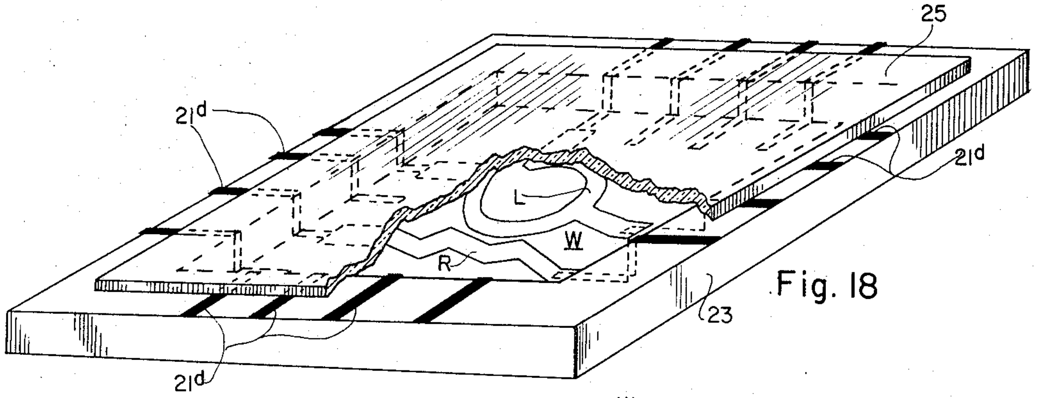
Figure 17:
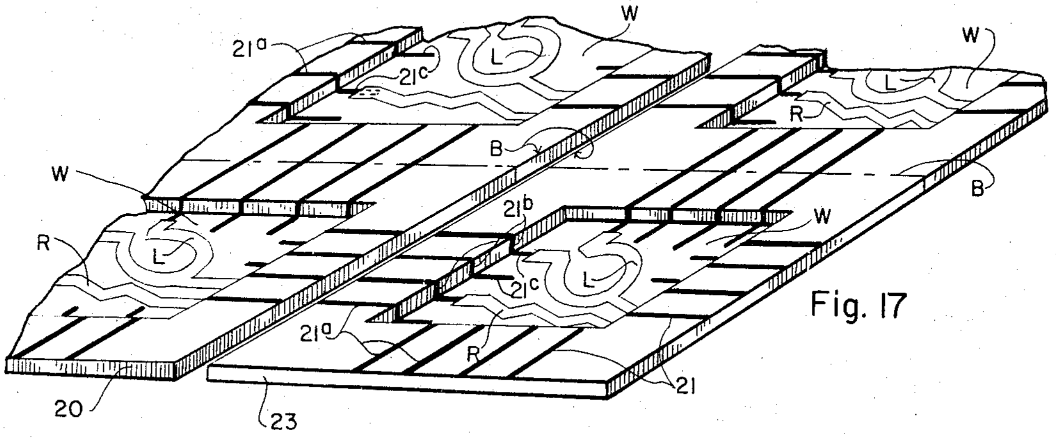
Figure 16:
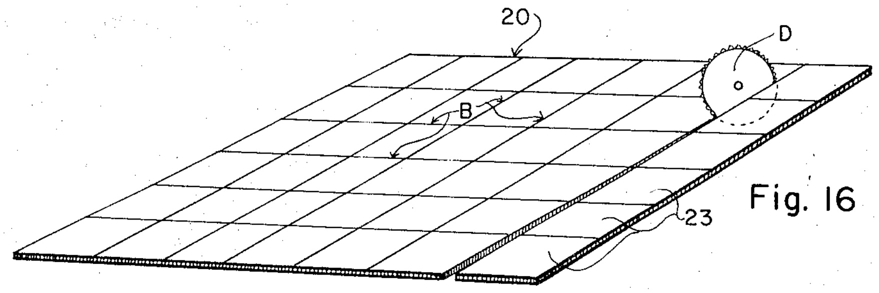
Figure 19:
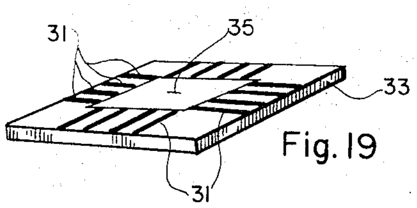

FIGS. 13 and 14 respectively show the completed electric circuitry in the two united box members, and the lid which is intended to close this circuitry, FIG. 14 being on a reduced scale;

FIG. 15 is a perspective view of a completed module according to this first modification;

FIG. 16 shows a substrate plate including a plurality of modular wafers in the process of being separated, and comprising a second modified form of the invention;

FIG. 17 is an enlarged perspective view of the lower right-hand corner of FIG. 16, and provided with a detailed showing of the metalized connectors and the overlapping deposited electrical circuitry;

FIG. 18 is a further enlarged perspective view of one completed module according to this second modification and showing the lid element partially broken away to reveal part of the circuitry; and FIG. 19 is a perspective view of a third modification in which the circuitry is hermetically sealed by filling the cavity with a passivating plastic material.

Figures 1, 2, 3, 4, 5, 6, 7:
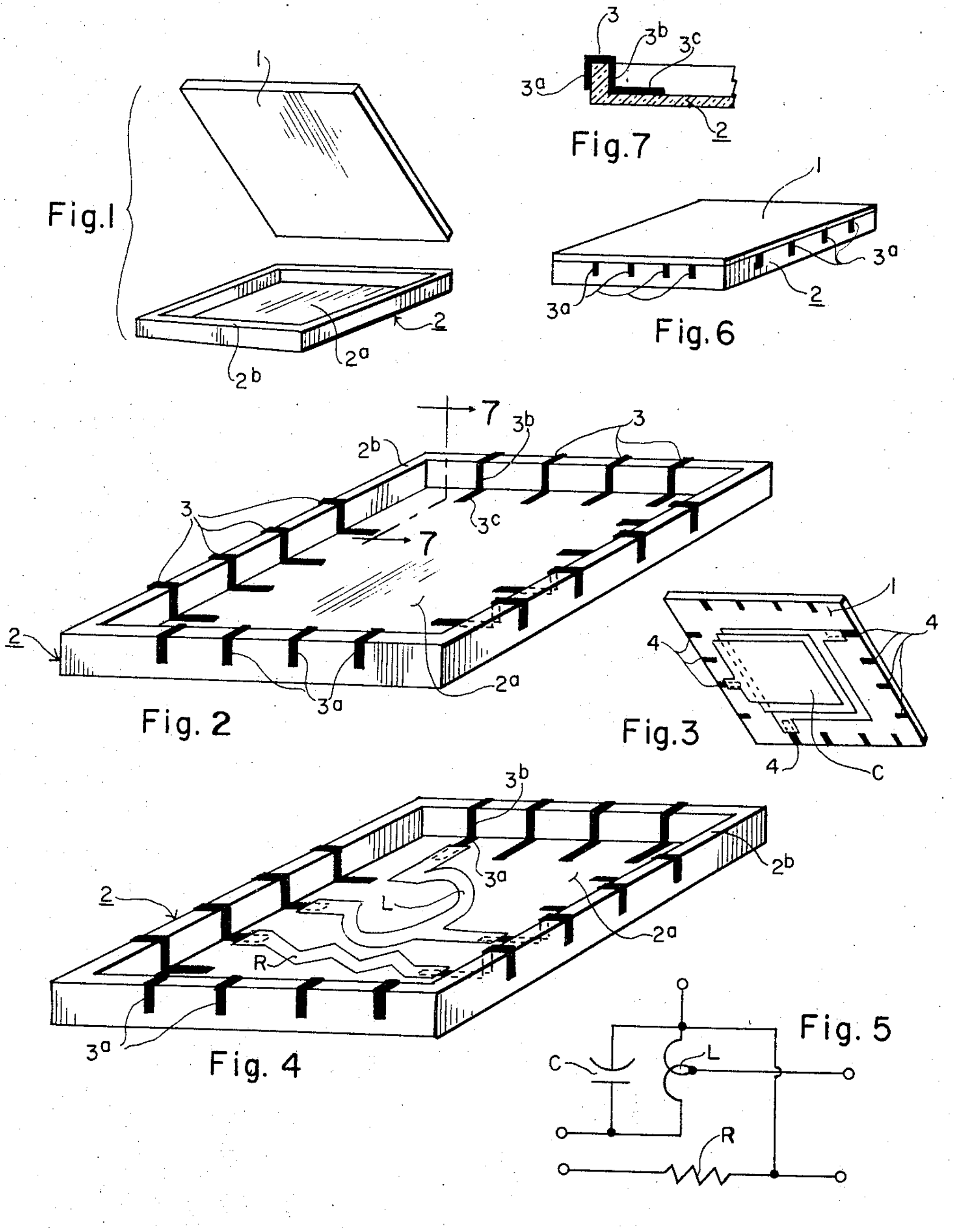
FIG. 1 is an exploded perspective view showing a two-member modular package.
FIG. 2 shows an enlarged perspective view of the lower member of the module provided with metallized connectors.
FIGS. 3 and 4 are perspective views showing electric circuitry applied over some of the metalized connectors after completion of the latter.
FIG. 5 shows a schematic diagram of the resulting circuitry when the lid of FIG. 3 is mated with the lower modular member of FIG. 4.
FIG. 6 shows the finally sealed module.
FIG. 7 is a section view taken along line 7—7 of FIG. 2.

Referring now to the sheet of drawings including FIGS. 1 through 7, this group of drawings not only illustrates one practical structural embodiment, but it also serves to illustrate various stages in the process by which the present invention is carried out. According to this process, certain box members are provided which when all put together form a complete hermetically sealed package containing, for example. a microelectric circuit. FIG. 1 shows a two-element box including a lid member 1 and a box member 2 comprising a wafer having a recessed central portion 2*a* surrounded by peripheral flange or lip portions 2*b*. In the illustration of FIG. 1, the members 1 and 2 are made of a suitable substrate material, for example, glass.

The next step in the process involves the application of outside connector means to one or both of the box members 1 and 2 by metalizing certain areas. The type of metalization depends, of course, on the particular substrate material and may include any one or more of a number of well-known metalizing expedients. For example, if the box members 1 and 2 are made of glass, then a satisfactory approach would be to paint the outside connector strips 3 onto the surface of each of the members, and then fire the glass frit strips 3 into the surface of the glass in a well-known manner. Incidentally, this technique results in no noticeable raising of the surface at the points where the strips are applied since the metal particles simply sink into the glass surface during the firing step of the process. It is also desirable to have opposite registering zones of the lid 1 metalized as shown in FIG. 3 by applying a glass frit and then firing it into the inner surface of the lid member 1.

When this step is completed, the lower box member 2 will have the appearance shown in FIG. 2, and will be ready to receive deposited electric circuitry, for instance as shown in FIGS. 3 and 4. FIG. 5 shows an example of an electronic circuit including a capacitor C, a tapped inductance L, and a resistance R connected together in a certain way. When the lid member 1, shown on a reduced scale in FIG. 3 and having the capacitor C located on its lower surface, is placed on the top of the lower box member 2 shown in FIG. 4 so that the metalized connector strips 3 and 4 mutually register. then the capacitor C is connected across the ends of the inductance L while at the same time the right end of the resistor R is connected to the far end of the inductance L to complete the circuit shown in FIG. 5. The two glass members 1 and 2 are then hermetically sealed all the way around their areas of mutual contact to form a completed and sealed box as shown in FIG. 6. This sealing step is well-known per se and results in the welding or fusion of the glass box members, as well as the blending of the deposited connector strips 3 and 4 as between the lid member and the lower member of the box. The module is then complete, and a plurality of connector portions 3*a* are accessible outside of the box so as to permit connections to be made with the internal circuitry.

The application of the connector strips 3 and 4 can be conveniently done, for instance by painting the glass frit on with a brush, or by spraying it through a template or other masking device, or by any other suitable means. At any rate, the important thing is that all of the connector strips 3 and 4 are deposited and complete before any of the electronic circuitry is applied to the substrates. Since this invention is primarily concerned with integrated and semi-integrated circuitry, once the connectors have been applied to the substrate members 1 and 2, and fired thereinto, then the substrate members are placed into a vacuum chamber in which the circuit members L, R, and C are added, probably by one of the various deposition processes. Of course, it is not intended that the invention be limited to vacuum deposition of the circuitry, but this is considered an optimum approach. It may be that semiconductor elements will also be included in the circuitry placed inside of the box before sealing, and if this is the case, the semiconductor circuit elements can either be deposited along with the other circuit elements, or they can be separately manufactured units placed in the box before or after deposition of the other circuitry to form a semi-integrated module.

FIG. 7 shows an exaggerated cross-sectional view of the metalized connector strips 3 applied to the box member 2 and showing an outer connector portion 3*a* and inner connector portions 3*b* and 3*c*, the latter lying in the bottom of the recess in the wafer and being overlapped by the ends of the deposited circuit members, such as L, C, and R so that connections are made therewith at the resulting metal interfaces.

Referring now to the sheet of drawings including FIGS. 8 through 15, these figures show a first modified form of the invention which is manufactured by a similar process with slight variations.

The approach shown in FIGS. 8 through 15 is particularly useful in sealing circuitry including heat-sensitive elements such as semiconductors which cannot stand the heat required to fuse the glass cover element 1 to the glass wafer member 2 as described in connection with FIGS. 1 through 7.

FIG. 8 shows a three-member box including a cover plate 11, an open frame 12, and a lower substrate 13. The members 12 and 13 are insulating materials and are suitable to serve as circuitry substrates. The lid member 11, however, may be of some other material which can be cemented or soldered to the periphery of the frame 12 after the circuitry has been deposited on the substrates, especially if it includes heat-sensitive materials which can stand the heat of soft soldering but could not stand the heat of glass-fusion.

The process which would be followed in connection with FIGS. 8 through 15 includes the application of metalized connector strips both to the lower substrate 13 and to the frame member 12 as shown in FIG. 9. The metalizing materials 14 and 15, can, again, be painted or sprayed or otherwise applied as shown in FIG. 9 and fired into the surfaces. Then the frame 12 is united as by fusion with the substrate member 13 as shown in FIG. 10 to provide a composite connector strip 16. When the members 12 and 13 are fused together, they form a composite lower substrate wafer as shown in FIG. 11 having the connectors 16 completed and unified with the box material. It will be noted that there is a connector 17 which is formed by extending the metalization up the back of the frame at 17*a* and across the top surface of the frame at 17*b*. This connector 17 serves as a connection to the lid 11 of the box where it is a metal lid as shown in FIG. 14, thereby at the same time providing a ground connection for the circuitry inside of the module and a shield plate formed by the metal lid 11 serving to isolate the contents of this modular box from those of adjacent modular boxes which may be stacked thereagainst, and perhaps sealed thereto.

If the lid 11 is made of a material to which solder adheres, it may be desirable to extend the metalization at 17*b* completely around the upper surface of the frame member 12 so as to provide a surface to which the metal lid can be soldered, for instance as shown in Lathrop Patent 2,989,669. On the other hand, if the lid member 11 is to be cemented to the frame member 12, then metalization is not necessary. In still another modification, the lid 11 might comprise a ceramic plate, itself having metalized edges which can be soldered to similar metalized edges around the frame member 12. The prior art is, of course, full of suggestions as to how to make joints between various materials. The characterizing feature of the modified forms shown in FIGS. 8 through 15 is that the connectors 16 do not touch the lid member 11 when the latter is placed upon the frame member 12 and sealed thereto to form a completed module, as shown in FIG. 15. Therefore, lid member 11 may be metal since it will not short-circuit the connector members 16.

Once the lower box portion is completed as shown in FIG. 11, including the member 13 connected with the frame member 12 and including the metalized connectors 16 and 17, then this assembly undergoes circuitry deposition steps necessary to apply the circuit members such as the resistance R and the inductance L as shown in FIG. 13. The metal lid 11 may also be used as a capacitor when assembled in operative relationship with the circuitry deposited on the surface 13*a*.

Still another interesting combination can include the uniting of two recessed wafer structures, for instance both of the types shown in FIG. 4, and each including electronic circuit components which become mutually cooperative when the two deposited partial circuits are assembled. In other words, the lid in FIG. 1 could be replaced by another recessed wafer of the type shown in FIGS. 2 and 4 so that the two lip portions 2*b* are sealed together. If two units as shown in FIG. 4 are used, with the result that their connectors 3 register with each other, the circuitry in each of them becomes interconnected with the circuitry in the other. On the other hand, if two units as shown in FIG. 13 were united by sealing their frame members together at 12*a*, no interconnection would result and each of the frame members would be considered as a separate circuit whose substrate panel 13 sealed the other circuit. There are, of course, numerous ways of stacking these modular assemblies and subassemblies in order to provide a larger unit. In cases where interconnection is desired between external connectors, this can easily be accomplished by interwiring outside of the frame members 12. This might perhaps be done by providing spring finger clips into which the modular wafers would be inserted and using wiring between the clips as external interconnections not only between modules, but also with other external circuitry.

The sheet of drawings including FIGS. 16, 17, and 18 shows a substantial advance in the mass production of integrated circuitry. For instance, a large substrate sheet 20 can be provided which can be divided into separate wafers 23, for instance by cutting along the crossing lines B with a diamond saw D as shown in FIG. 16. This approach has certain very substantial production advantages, principally based upon the fact that all similar steps can be simultaneously conducted with respect to all of the wafers 23 being manufactured and before the various wafers are separated either by diamond sawing, or by scoring and breaking the units along the lines B.

FIG. 17 is an enlargement of the lower right-hand corner of FIG. 16 showing details of the circuitry. The substrate plate 20 is provided with waffle-like recesses W for receiving the circuitry to be later deposited. The entire plate is then provided with external connector strips 21 which lie across the upper surface of the substrate 20, as at 21*a*, FIG. 17, and these metalized connector strips 21 having portions 21*b* extending down the side walls of the recesses W. Each connector strip further includes a portion 21*c* lying in the very bottom of each recess W, and it is the portions 21*c* of the connector strips to which the circuitry elements L and R connect by overlapped interface contact.

When the connectors 21 have been completed, then the entire substrate plate 20 is inserted in the deposition apparatus, and suitable masks are placed over each recess W and the deposition steps are carried out simultaneously with respect to all of the recess locations W, thereby providing an efficient mass production process. When the deposition is completed, the plate 20 is then divided as shown in FIG. 16 into a plurality of individual wafers 23, one of which is shown enlarged in FIG. 18. The manufacturing process is then completed by applying a closure lid member 25 over the recessed circuitry with the periphery of the lid member extending only part-way out upon the upper surface of the wafer 23 so that the connector strips 21 will be partially exposed as at lid 21*d*, whereby external connections can be made thereto since the lid member 25 does not completely cover the connectors at 21*d*. The manner in which the lid member 25 is attached to the surface of the wafer 23 depends, of course, upon the particular materials being joined, and may include fusion or cementing, etc. The lid element 25 may also include cross-over wiring as shown in FIGS. 3 and 5, and it may also include other reactive circuit elements also illustrated in those figures.

FIG. 19 shows a third modification in which a substrate wafer 33 is provided with fired-on connector strips 31 which extend into a central cavity in which electric circuit elements (not shown) has been deposited, for example as shown in FIGS. 4, 13, or 17. In this modification no lid cover is provided, but the circuitry in the cavity is hermetically sealed by filling the cavity with a plastic material 35 which can be set once it is in place, in a manner well known per se. This approach is useful especially in sealing circuitry which is very thermosensitive, since all heating for any purpose is completed before the circuitry is deposited in the cavity.

This invention is not to be limited to the exact processes and structures illustrated and described in connection with the drawings, for obviously changes may be made therein within the scope of the following claims.

I claim:

1. The process of manufacturing sealed micro-circuitry modules including networks of integrated deposited circuit elements, comprising the steps of:

(a) providing circuit packaging members including an insulating glass substrate having a raised ridge surrounding a circuit-element-receiving cavity recessed below the ridge to a depth at least equalling the height of the elements to be deposited;

(b) applying to the substrate spaced conductive metallized connector films, each having an external portion extending to a location outside of said packaging members for the purpose of providing external connections for the network elements when deposited within the cavity, and each extending into a location within the circuit-element-receiving cavity;

(c) firing the films onto the surface to which they are applied;

(d) subsequently depositing circuit-element networks in the recessed cavity including depositing portions of elements in overlapping relationship with said connector film portions located within the cavity; and (e) sealing the circuitry by applying a cover member over the recessed cavity and bonding it to the raised ridge while leaving exposed at least part of said external portion of each connector film.

2. The process of manufacturing sealed micro-circuitry modules including networks of integrated deposited circuit elements, comprising the steps of:

(a) providing circuit packaging members including a glass wafer having a raised ridge surrounding a circuit-element-receiving cavity recessed below the ridge, and including a glass cover shaped to overlie said cavity and contact the ridge;

(b) applying to the wafer spaced conductive glass-frit connector films, each having an external portion extending across the ridge to a location outside of said wafer for the purpose of providing external connections for the network elements when deposited within the cavity, and each extending into a location within the circuit-element-receiving cavity;
(c) applying to the inside surface of the glass cover spaced glass-frit conductor films located to register respectively with films on the wafer;
(d) subsequently depositing circuit-element networks in the recessed cavity and on the inside surface of the cover, said networks including portions of elements deposited in overlapping relationship with said film portions; and
(e) sealing the circuitry by applying the cover over the recessed cavity and fusing it to the raised ridge with said films also fused in mutual registration, while leaving exposed at least part of said external portion of each connector film.

3. The process of manufacturing sealed micro-circuitry modules including networks of integrated deposited circuit elements, comprising the steps of:
(a) providing circuit packaging members including an insulating glass substrate wafer having a raised ridge surrounding a circuit-element-receiving cavity recessed below the ridge, and including an insulating substrate cover shaped to contact the ridge;
(b) applying to the substrate wafer spaced metallic conductive connector films, each having an external portion extending across the ridge to a location outside of said wafer for the purpose of providing external connections for the network elements when deposited within the cavity, and each extending into a location within the circuit-element-receiving cavity;
(c) applying to the inside surface of the cover spaced conductor films located to register respectively with films on the wafer;
(d) firing the films onto the surface to which they are applied;
(e) subsequently depositing circuit-element networks in the recessed cavity and on the inside surface of of the cover, said networks including portions of elements deposited in overlapping relationship with said film portions; and
(f) sealing the circuitry by applying a cover member over the recessed cavity and bonding it to the raised ridge with with said films in mutual contact, while leaving exposed at least part of said external portion of each connector film.

4. The process of manufacturing sealed micro-circuitry modules including networks of integrated deposited circuit elements, comprising the steps of:
(a) providing an insulating glass substrate plate having a waffle-like surface including raised ridges surrounding multiple circuit-element-receiving cavities recessed therebelow to receive said circuit elements when deposited;
(b) applying to the substrate around each cavity spaced metallic conductive connector films, each extending at least part-way across the ridge outside of said cavity for the purpose of providing external connections, and each film extending into a location within the circuit-element-receiving cavity;
(c) firing the films onto the surfaces to which they are applied;
(d) subsequently depositing circuit-element networks simultaneously in all of the cavities including depositing portions of each network in overlapping relationship with connector films within the cavity;
(e) separating the substrate plate into separate modules each including at least one network by severing it along the tops of the ridges; and
(f) sealing the modules by applying covers over their cavities and bonding the covers to the raised ridges while leaving exposed selective portions of the conductive connector films thereon.

5. The process of manufacturing sealed micro-circuitry modules including networks of integrated deposited circuit elements, comprising the steps of:
(a) providing a glass substrate plate having a waffle-like surface including raised ridges surrounding multiple circuit-element-receiving cavities recessed therebelow to receive said circuit elements when deposited;
(b) applying to the plate around each cavity spaced conductive glass-frit connector films, each extending at least part-way across the ridge outside of said cavity for the purpose of providing external connections, and each film extending into a location within the circuit-element-receiving cavity;
(c) fusing the films into the surfaces to which they are applied;
(d) subsequently depositing circuit-element networks simultaneously in all of the cavities including depositing portions of each network in overlapping relationship with connector films within the cavity;
(e) separating the substrate plate into separate modules each including at least one network by severing it along the tops of the ridges; and
(f) sealing the modules by applying glass covers over their cavities and fusing the covers to the raised ridges while leaving exposed selective portions of the conductive connector film thereon.

6. The process of manufacturing sealed micro-circuitry modules including networks of integrated deposited circuit elements, comprising the steps of:
(a) providing an insulating glass substrate plate having a waffle-like surface including raised ridges surrounding multiple circuit-element-receiving cavities recessed therebelow to receive said circuit elements when deposited;
(b) applying to the substrate around each cavity spaced metallic conductive connector films, each extending at least part-way across the ridge outside of said cavity for the purpose of providing external connections, and each film extending into a location within the circuit-element-receiving cavity;
(c) firing the films onto the surfaces to which they are applied;
(d) subsequently depositing circuit-element networks simultaneously in all of the cavities including depositing portions of each network in overlapping relationship with connector films within the cavity;
(e) filling all of the cavities with a sealing material to passivate the circuitry, while leaving exposed at least a portion of each connector film on the ridges; and
(f) separating the substrate plate into separate modules each including at least one network by severing it along the tops of the ridges.

References Cited

UNITED STATES PATENTS

| | | | |
|---|---|---|---|
| 2,994,121 | 8/1961 | Shockley | 29—25.3 |
| 3,072,832 | 1/1963 | Kilby | 317—235 |
| 3,077,511 | 2/1963 | Bohrer | 29—155.5 X |
| 3,220,095 | 11/1965 | Smith | 29—155.5 |
| 3,262,022 | 7/1966 | Caracciolo | 317—101 |
| 3,270,399 | 9/1966 | Ohntrup | 29—155.5 |

WILLIAM I. BROOKS, *Primary Examiner.*